(12) United States Patent
Kosuge

(10) Patent No.: US 8,912,688 B2
(45) Date of Patent: Dec. 16, 2014

(54) POWER SUPPLY SWITCH CIRCUIT

(75) Inventor: Yoshiaki Kosuge, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 629 days.

(21) Appl. No.: 13/373,100

(22) Filed: Nov. 4, 2011

(65) Prior Publication Data

US 2012/0126633 A1  May 24, 2012

(30) Foreign Application Priority Data

Nov. 19, 2010 (JP) ................... 2010-259327

(51) Int. Cl.
*H01H 47/00* (2006.01)
*H03K 19/00* (2006.01)

(52) U.S. Cl.
CPC .................. *H03K 19/0016* (2013.01)
USPC ............... 307/115; 326/62; 326/80; 326/83; 326/85; 326/86; 361/86

(58) Field of Classification Search
CPC ................................. H03K 19/0016
USPC ........................................ 307/115
See application file for complete search history.

(56) References Cited

U.S. PATENT DOCUMENTS

| | | | |
|---|---|---|---|
| 7,659,746 B2 * | 2/2010 | Chua-Eoan et al. | 326/83 |
| 8,134,811 B2 * | 3/2012 | Klikic et al. | 361/8 |
| 2003/0102904 A1 | 6/2003 | Mizuno et al. | |
| 2003/0184364 A1 | 10/2003 | Miyagi | |
| 2005/0024124 A1 | 2/2005 | Mizuno et al. | |
| 2006/0184808 A1 | 8/2006 | Chua-Eoan et al. | |
| 2006/0267676 A1 | 11/2006 | Mizuno et al. | |
| 2007/0079147 A1 | 4/2007 | Pyeon et al. | |
| 2009/0257162 A1 * | 10/2009 | Garrett | 361/86 |
| 2009/0315591 A1 | 12/2009 | Pyeon et al. | |
| 2010/0052775 A1 | 3/2010 | Mizuno et al. | |

FOREIGN PATENT DOCUMENTS

| | | | |
|---|---|---|---|
| JP | 2003-168735 A | | 6/2003 |
| JP | 2003-289245 A | | 10/2003 |
| JP | 2008-532265 A | | 8/2008 |
| JP | 2009-510846 A | | 3/2009 |

OTHER PUBLICATIONS

Notification of Reason(s) for Refusal dated Apr. 8, 2014, with English translation.

* cited by examiner

*Primary Examiner* — Rexford Barnie
*Assistant Examiner* — Toan Vu
(74) *Attorney, Agent, or Firm* — McGinn IP Law Group, PLLC

(57) ABSTRACT

A power supply switch circuit according to an aspect of the present invention includes a first switch element that is connected between a first power supply line and a second power supply line and switches connection and disconnection between the first power supply line and the second power supply line according to a first enable signal; a second switch element that is connected between the first power supply line and the second power supply line and switches connection and disconnection between the first power supply line and the second power supply line; and a switch control circuit that includes at least one logic gate supplied with power from the second power supply line and controls the second switch element. The switch control circuit controls the second switch element based on a second enable signal supplied to the switch control circuit and on a voltage of the second power supply line.

17 Claims, 13 Drawing Sheets

POWER SUPPLY SWITCH CIRCUIT

CROSS-REFERENCE TO RELATED APPLICATIONS

This application is based upon and claims the benefit of priority from Japanese patent application No. 2010-259327, filed on Nov. 19, 2010, the disclosure of which is incorporated herein in its entirety by reference.

BACKGROUND

The present invention relates to a power supply switch circuit, and more particularly, to a power supply switch circuit capable of suppressing generation of a rush current.

In recent years, portable electronic devices have been widely used. Under such circumstances, there is an increasing demand for driving portable electronic devices for a longer period of time. To satisfy this demand, it is important to reduce power consumption also in the technical field of semiconductor integrated circuits.

A power supply switch circuit is known as one of techniques for reducing power consumption. In the power supply switch circuit, a MOS transistor is used to reduce a leak current. In power supply switch circuit, however, power supply noise is undesirably caused due to a rush current generated upon turning on of a power supply switch.

Japanese Unexamined Patent Application Publication No. 2003-289245 discloses a technique for suppressing such power supply noise. In a semiconductor integrated circuit disclosed in Japanese Unexamined Patent Application Publication No. 2003-289245, a plurality of power supply terminals of a logic circuit block are connected to a real power supply line through a leak current cut-off circuit. In the case of activating the logic circuit block, the leak current cut-off circuit is used to electrically connect the power supply terminals of the logic circuit block to the real power supply line with a predetermined time delay. This configuration makes it possible to suppress a potential drop of the real power supply line which is caused upon activation of the logic circuit block, and to suppress power supply noise, thereby preventing a malfunction from occurring in other activated logic circuit blocks due to power supply noise.

Published Japanese Translation of PCT International Publication for Patent Application, No. 2008-532265 discloses a technique involving a power supply switch circuit for allowing each power domain to be enabled. In the technique disclosed in Published Japanese Translation of PCT International Publication for Patent Application, No. 2008-532265, enable signals for power supply switches are divided into groups and a dedicated control circuit for controlling a power supply switch operation is used to control the power supply switches to turn on at different timings.

FIG. 13 is a diagram for explaining the power supply switch circuit disclosed in Published Japanese Translation of PCT International Publication for Patent Application, No. 2008-532265. The power supply switch circuit shown in FIG. 13 includes a control circuit 110 and a power domain 102. The power domain 102 includes a plurality of power supply switch circuits 211 to 219 and domain circuit elements 220, 221, and 222. The power domain 102 also includes a first power supply bus 107, a local power supply bus 204, and a second power supply bus 108. Enable signals EN1 and EN2 are supplied from the control circuit 110 to the power domain 102.

As shown in FIG. 13, the power supply switch circuits 211 to 219 are arranged in a distributed manner over the power domain 102. The power supply switch circuits 211 to 219 connect the first power supply bus 107 and the local power supply bus 204 according to the enable signals. The enable signal EN1 is supplied to the power supply switch circuit 211. A path for the enable signal EN2 extends through the power supply switch circuits 212 to 219. The enable signal EN2 is supplied to each of the power supply switch circuits 212 to 219 while sequentially passing through the power supply switch circuits 212 to 219. This allows the power supply switch circuits 212 to 219 to sequentially turn on.

In the case of supplying power to the power domain, the control circuit 110 supplies the enable signal EN1 for turning on the power supply switch 211 to the power supply switch 211. At this time, only the power supply switch 211 turns on. After lapse of a predetermined period of time, the enable signal EN2 for turning on the power supply switch circuits 212 to 219 is supplied to each of the power supply switch circuits 212 to 219. At this time, the enable signal EN2 passes through the power supply switch circuits 212 to 219, so that the power supply switch circuits 212 to 219 sequentially turn on.

Thus, in the power supply switch circuit disclosed in Published Japanese Translation of PCT International Publication for Patent Application, No. 2008-532265, the power supply switch circuits 211 to 219 can be sequentially turned on at time intervals, which results in avoiding the generation of a large current when the first power supply bus 107 and the local power supply bus 204 are connected together.

SUMMARY

In the technique disclosed in Published Japanese Translation of PCT International Publication for Patent Application, No. 2008-532265, the power supply switch circuits 211 to 219 are turned on at time intervals to thereby suppress generation of a rush current flowing through the domain circuit element and generation of power supply noise. In order to control the power supply switch circuits 211 to 219 in this manner, the enable signals are divided into the enable signal EN1 and the enable signal EN2. The power supply switch circuit 211 is first turned on by the enable signal EN1, and the power supply switch circuits 212 to 219 are then turned on by the enable signal EN2.

The power supply switch circuit disclosed in Published Japanese Translation of PCT International Publication for Patent Application, No. 2008-532265 requires the control circuit 110 for controlling the two enable signals EN1 and EN2 in the manner as described above. The control circuit 110 includes a 2-bit enable register, a 5-bit count register, a 5-bit count-down counter, a 5-bit OR gate, a two-input OR gate, a two-input AND gate, and two inverters (see FIG. 7 of Published Japanese Translation of PCT International Publication for Patent Application, No. 2008-532265). Accordingly, in the power supply switch circuit disclosed in Published Japanese Translation of PCT International Publication for Patent Application, No. 2008-532265, it is necessary to add the control circuit 110, which results in an increase in the chip area.

A first aspect of the present invention is a power supply switch circuit that applies a power supply voltage from a first power supply line to a second power supply line, including: a first switch element that is connected between the first power supply line and the second power supply line and switches connection and disconnection between the first power supply line and the second power supply line according to a first enable signal; a second switch element that is connected between the first power supply line and the second power supply line and switches connection and disconnection between the first power supply line and the second power supply line; and a switch control circuit that includes at least one logic gate supplied with power from the second power supply line and controls the second switch element. The switch control circuit controls the second switch element based on a second enable signal supplied to the switch control circuit and on a second power supply voltage, the second power supply voltage being a voltage of the second power supply line.

In the power supply switch circuit according to the first aspect of the present invention, during a period between the time when the first switch element turns on and the power supply voltage is applied from the first power supply line to the second power supply line through the first switch element and the time when the power supply voltage of the second power supply line becomes a predetermined voltage, the second switch element can be maintained in an off state. After the power supply voltage of the second power supply line becomes the predetermined voltage, the power supply voltage can be applied from the first power supply line to the second power supply line through the second switch element. In the power supply switch circuit according to the first aspect of the present invention, a logic gate supplied with power from the second power supply line is used to configure the switch control circuit for controlling the second switch element. This makes it possible to suppress an increase in the chip area.

According to an aspect of the present invention, it is possible to provide a power supply switch circuit capable of suppressing generation of a rush current without increasing the chip area.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Embodiments of the present invention will be described with reference to the accompanying drawings.

Figure 1:
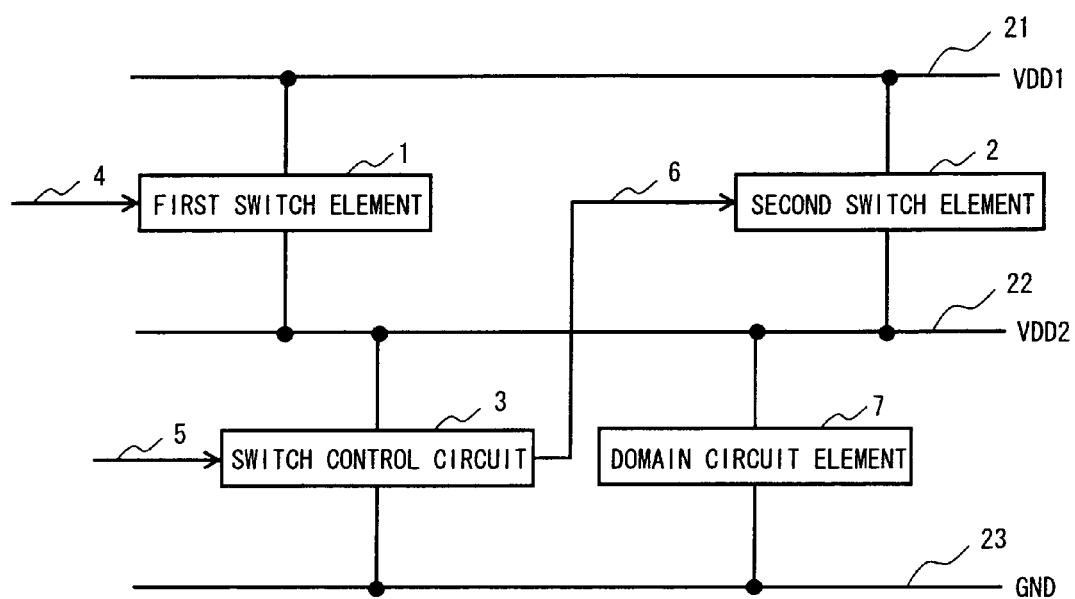
FIG. 1 is a block diagram showing a power supply switch circuit according to a first embodiment.

FIG. 1 is a block diagram showing a power supply switch circuit according to a first embodiment of the present invention. The power supply switch circuit shown in FIG. 1 includes a first switch element 1, a second switch element 2, and a switch control circuit 3. The power supply switch circuit according to the first embodiment is a power supply switch circuit that applies a power supply voltage from a first power supply line (VDD1) 21 to a second power supply line (VDD2) 22. A domain circuit element 7 is connected between the second power supply line (VDD2) 22 and a third power supply line (GND) 23.

The first switch element 1 is connected between the first power supply line 21 and the second power supply line 22 and switches connection and disconnection between the first power supply line 21 and the second power supply line 22 according to a first enable signal 4.

The second switch element 2 is connected between the first power supply line 21 and the second power supply line 22 and switches connection and disconnection between the first power supply line 21 and the second power supply line 22 according to a control signal 6 output from the switch control circuit 3.

The switch control circuit 3 includes at least one logic gate supplied with power from the second power supply line 22, and controls the second switch element 2. Specifically, the switch control circuit 3 controls the second switch element 2 based on a second enable signal 5 supplied to the switch control circuit 3 and on a second power supply voltage (VDD2) which is the voltage of the second power supply line 22. Hereinafter, a specific circuit example of the power supply switch circuit according to the first embodiment will be described.

Figure 2:
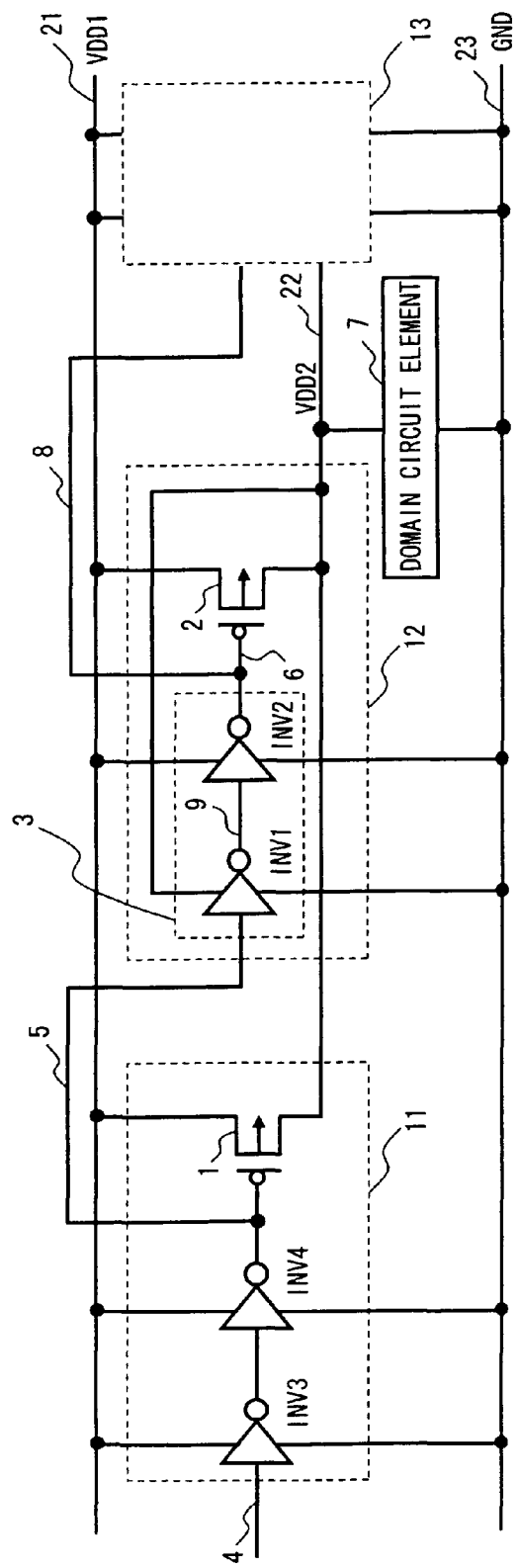
FIG. 2 is a circuit diagram showing the power supply switch circuit according to the first embodiment.

FIG. 2 is a circuit diagram showing the power supply switch circuit according to the first embodiment. The power supply switch circuit shown in FIG. 2 includes a first switch circuit 11 and a second switch circuit 12. The first switch circuit 11 includes an inverter (fifth inverter) INV3, an inverter (sixth inverter) INV4, and the first switch element 1.

The inverter INV3 is supplied with power from each of the first power supply line (VDD1) 21 and the third power supply line (GND) 23 and receives the first enable signal 4. The inverter INV3 inverts the received first enable signal 4 and outputs the inverted signal to the inverter INV4. The inverter INV4 is supplied with power from each of the first power supply line (VDD1) 21 and the third power supply line (GND) 23, and is also supplied with the output signal from the inverter INV3. The inverter INV4 inverts the output signal from the inverter INV3 and outputs the inverted signal to the gate of the first switch element 1.

The output signal from the inverter INV4 is supplied as the second enable signal 5 to the second switch circuit 12. In the circuit shown in FIG. 2, the first enable signal 4 may be supplied as the second enable signal 5 to the second switch circuit 12.

The first switch element 1 is configured as a P-channel transistor, for example. The source of the first switch element 1 is connected to the first power supply line 21. The gate of the first switch element 1 is connected to the output of the inverter INV4. The drain of the first switch element 1 is connected to the second power supply line 22.

The second switch circuit 12 includes an inverter (first inverter) INV1, an inverter (second inverter) INV2, and the second switch element 2. The inverter INV1 and the inverter INV2 constitute the switch control circuit 3.

The inverter INV1 is supplied with power from each of the second power supply line (VDD2) 22 and the third power supply line (GND) 23 and receives the second enable signal 5. The inverter INV1 outputs a signal 9, which is obtained by inverting the received second enable signal 5, to the inverter INV2. The inverter INV2 is supplied with power from each of the first power supply line (VDD1) 21 and the third power supply line (GND) 23, and is also supplied with the output signal from the inverter INV1. The inverter INV2 outputs the control signal 6, which is obtained by inverting the output signal from the inverter INV1, to the gate of the second switch element 2. The output signal from the inverter INV2 is supplied as an enable signal 8 to a subsequent-stage switch circuit 13.

The second switch element 2 is configured as a P-channel transistor, for example. The source of the second switch element 2 is connected to the first power supply line 21. The gate of the second switch element 2 is connected to the output of the inverter INV2. The drain of the second switch element 2 is connected to the second power supply line 22.

The domain circuit element 7 is connected between the second power supply line (VDD2) 22 and the third power supply line (GND) 23. The power supply switch circuit according to the first embodiment may further include a plurality of switch circuits 13 at the subsequent stage of the second switch circuit 12.

Next, operation of the power supply switch circuit according to the first embodiment shown in FIG. 2 will be described. Though operations of the switch circuit 11 and the switch circuit 12 will be described below, similar operations are carried out also in the case where a larger number of switch circuits are provided.

When a high-level signal is supplied as the first enable signal 4 to the inverter INV3 of the first switch circuit 11, the inverter INV3 outputs a low-level signal (GND) to the inverter INV4. The term "high-level signal" herein described refers to a signal having a level that allows an inverter to perform an inversion operation and having a voltage higher than a threshold voltage of the inverter.

When the inverter INV4 is supplied with the low-level signal which is the output signal from the inverter INV3, the inverter INV4 supplies the high-level signal (VDD1) to the gate of the first switch element 1. The gate of the first switch element 1 is supplied with the high-level signal, which allows the first switch element 1 to turn off.

The inverter INV4 outputs the high-level signal as the second enable signal 5. When the high-level signal is supplied as the second enable signal 5 to the inverter INV1 of the second switch circuit 12, the inverter INV1 outputs the low-level signal to the inverter INV2.

When the low-level signal, which is the output signal from the inverter INV1, is supplied to the inverter INV2, the inverter INV2 supplies the high-level signal to the gate of the second switch element 2. The gate of the second switch element 2 is supplied with the high-level signal, which allows the second switch element 2 to turn off.

Accordingly, when the high-level signal is supplied as the first enable signal 4, the first switch element 1 and the second switch element 2 turn off, with the result that the first power supply line 21 and the second power supply line 22 are disconnected.

When the low-level signal is supplied as the first enable signal 4 to the inverter INV3 of the first switch circuit 11, the inverter INV3 outputs the high-level signal to the inverter INV4. The term "low-level signal" herein described refers to a signal having a level that allows an inverter to perform an inversion operation and having a voltage lower than a threshold voltage of the inverter.

When the inverter INV4 is supplied with the high-level signal which the output signal from the inverter INV3, the inverter INV4 supplies the low-level signal to the gate of the first switch element 1. At this time, the gate of the first switch element 1 is supplied with the low-level signal, which allows the first switch element 1 to turn on. As a result, a first power supply voltage (VDD1) is applied from the first power supply line 21 to the second power supply line 22 through the first switch element 1.

The inverter INV4 outputs the low-level signal as the second enable signal 5. When the low-level signal is supplied as the second enable signal 5 to the inverter INV1 of the second switch circuit 12, the inverter INV1 outputs the power supply voltage (VDD2) of the second power supply line 22 to the inverter INV2.

Figure 3:
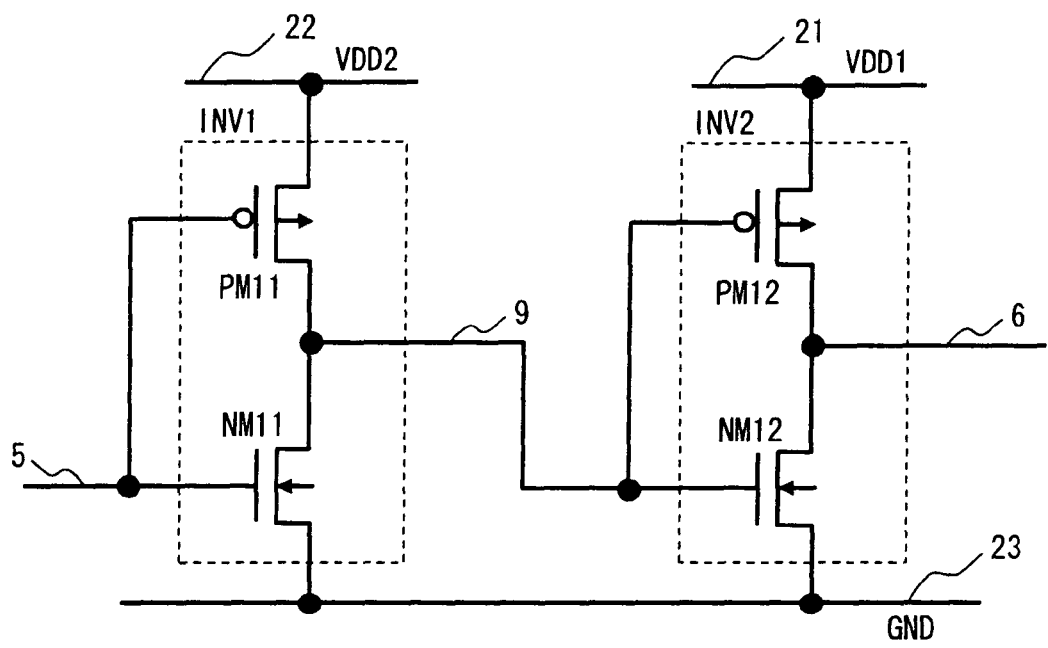
FIG. 3 is a circuit diagram showing a switch control circuit included in the power supply switch circuit according to the first embodiment.

FIG. 3 is a circuit diagram showing the switch control circuit included in the power supply switch circuit according to the first embodiment. Specifically, as shown in FIG. 3, when the low-level signal is supplied as the second enable signal 5, a P-channel transistor PM11 included in the inverter INV1 turns on, and an N-channel transistor NM11 included in the inverter INV1 turns off. As a result, the second power supply voltage (VDD2) is output as the signal 9 from the inverter INV1.

The second power supply voltage (VDD2), which is supplied as the signal 9 to the inverter INV2, is applied to the gate of a P-channel transistor PM12 constituting the inverter INV2 and the gate of an N-channel transistor NM12. When the second power supply voltage (VDD2) is lower than a threshold voltage of the inverter INV2, i.e., when the second power supply voltage (VDD2) is lower than a threshold voltage of the N-channel transistor NM12, the N-channel transistor NM12 is maintained in an off state and the P-channel transistor PM12 is maintained in an on state. Accordingly, the inverter INV2 outputs the first power supply voltage (VDD1), which is the high-level signal, as the control signal 6. The gate of the second switch element 2 is supplied with the high-level signal (VDD1), which allows the second switch element 2 to remain in the off state.

When the first power supply voltage (VDD1) is continuously applied from the first power supply line 21 to the second power supply line 22 through the first switch element 1, the second power supply voltage (VDD2) rises. When the second power supply voltage (VDD2) is higher than the threshold voltage of the inverter INV2 (voltage allowing the inverter INV2 to perform an inversion operation), i.e., when the second power supply voltage (VDD2) is higher than the threshold voltage of the N-channel transistor NM12, the N-channel transistor NM12 turns on and the P-channel transistor PM12 turns off. At this time, the inverter INV2 outputs the third power supply voltage (GND), which is the low-level signal, as the control signal 6. The gate of the second switch element 2 is supplied with the low-level signal (GND), which allows the second switch element 2 to turn on. As a result, the first power supply voltage (VDD1) is applied from the first power supply line 21 to the second power supply line 22 through the second switch element 2.

Thus, in the power supply switch circuit according to the first embodiment, the second switch element 2 can be maintained in the off state during a period between the time when the first switch element 1 turns on and the first power supply voltage (VDD1) is supplied from the first power supply line 21 to the second power supply line 22 through the first switch element 1 and the time when the power supply voltage (VDD2) of the second power supply line 22 becomes equal to or higher than a predetermined voltage. After the power supply voltage (VDD2) of the second power supply line 22 becomes equal to or higher than the predetermined voltage, the first power supply voltage (VDD1) can be applied from the first power supply liner 21 to the second power supply line 22 through the second switch element 2.

At this time, until the second power supply voltage (VDD2) becomes equal to or higher than the threshold voltage of the inverter INV2, only the first switch element 1 connects the first power supply line 21 and the second power supply line 22. In this case, the first power supply line 21 and the second power supply line 22 are connected through a high resistance, thereby suppressing generation of a rush current. In conjunction with this, generation of power supply noise can also be suppressed. Furthermore, the second switch element 2 connects the first power supply line 21 and the second power supply line 22 after the second power supply voltage (VDD2) becomes equal to or higher than the predetermined voltage. At this time, the potential difference between the first power supply line 21 and the second power supply line 22 is small, which enables suppression of a rush current. Accordingly, the power supply noise can also be suppressed.

In the power supply switch circuit according to the first embodiment, circuits for implementing the above-mentioned operation can be formed using the inverter circuit INV1, which is supplied with power from the second power supply line, and the inverter circuit INV2. This eliminates the need for adding a dedicated control circuit. Consequently, an increase in the chip area can be suppressed.

Figure 4:
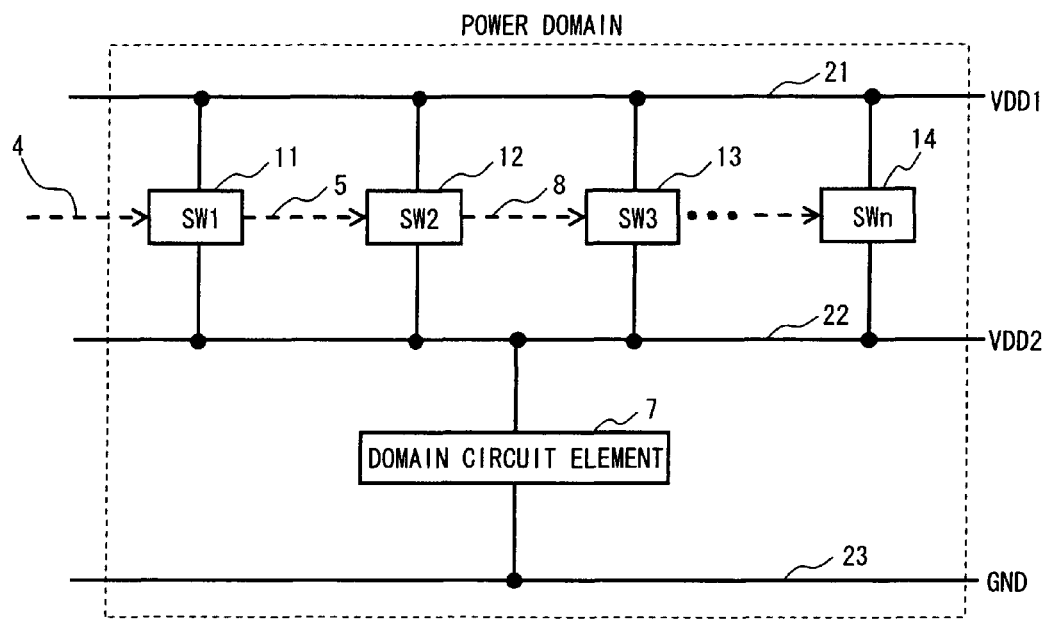
FIG. 4 is a diagram showing a power domain using the power supply switch circuit according to the first embodiment.

FIG. 4 is a diagram showing a power domain using the power supply switch circuit according to the first embodiment. As shown in FIG. 4, the power domain includes a first switch circuit (SW1) to an n-th switch circuit (SWn). The domain circuit element 7 is connected between the second power supply line (VDD2) 22 and the third power supply line (GND) 23.

In the power supply switch circuit according to the first embodiment, the first switch circuit (SW1) 11 is configured as the first switch circuit 11 shown in FIG. 2. The second switch circuit (SW2) 12 is configured as the second switch circuit 12 shown in FIG. 2. Each of the switch circuits subsequent to the third switch circuit (SW3) 13 may be configured as a switch circuit having a configuration similar to that of the first switch circuit 11 shown in FIG. 2, or may be configured as a switch circuit having a configuration similar to that of the second switch circuit 12 shown in FIG. 2. In other words, the circuits in the power domain shown in FIG. 4 may be formed by an arbitrary combination of circuits having a configuration similar to that of the first switch circuit 11 shown in FIG. 2 and circuits having a configuration similar to that of the second switch circuit 12 shown in FIG. 2.

According to the first embodiment as described above, it is possible to provide a power supply switch circuit capable of suppressing generation of a rush current without increasing the chip area.

Second Embodiment

Figure 5:
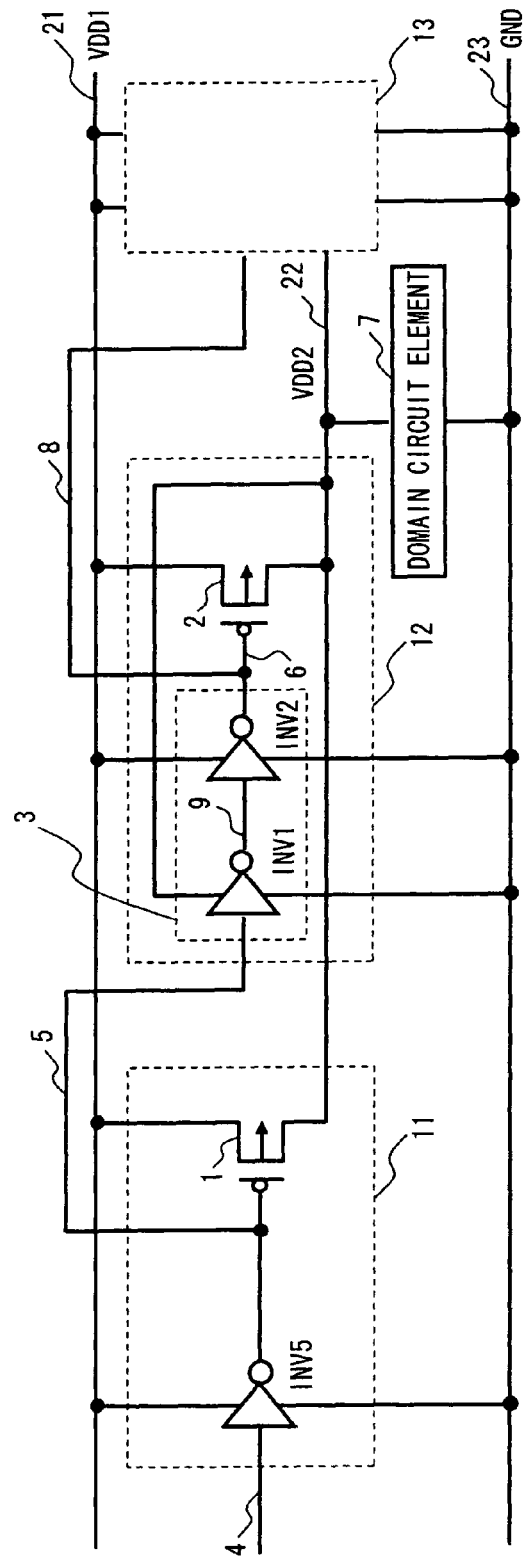
FIG. 5 is a block diagram showing a power supply switch circuit according to a second embodiment

Next, a second embodiment of the present invention will be described. FIG. 5 is a block diagram showing a power supply switch circuit according to the second embodiment. The power supply switch circuit according to the second embodiment shown in FIG. 5 differs from the power supply switch circuit according to the first embodiment shown in FIG. 2 in the configuration of the first switch circuit 11. The other components are similar to those of the power supply switch circuit according to the first embodiment, and thus a redundant explanation thereof is omitted.

The first switch circuit 11 of the power supply switch circuit shown in FIG. 5 includes an inverter (fourth inverter) INV5 and the first switch element 1.

The inverter INV5 is supplied with power from each of the first power supply line (VDD1) 21 and the third power supply line (GND) 23 and receives the first enable signal 4. The inverter INV5 inverts the received first enable signal 4 and outputs the inverted signal to the gate of the first switch element 1. The inverter INV5 outputs the signal, which is obtained by inverting the first enable signal 4, as the second enable signal 5 to the second switch circuit 12.

The first switch element 1 is configured as a P-channel transistor, for example. The source of the first switch element 1 is connected to the first power supply line 21. The gate of the first switch element 1 is connected to the output of the inverter INV5. The drain of the first switch element 1 is connected to the second power supply line 22.

When the high-level signal is supplied as the first enable signal 4 to the inverter INV5 of the first switch circuit 11, the inverter INV5 supplies the low-level signal to the gate of the first switch element 1. The gate of the first switch element 1 is supplied with the low-level signal, which allows the first switch element 1 to turn on. As a result, the first power supply voltage (VDD1) is applied from the first power supply line 21 to the second power supply line 22 through the first switch element 1.

The inverter INV5 outputs the low-level signal as the second enable signal 5. When the inverter INV1 of the second switch circuit 12 is supplied with the low-level signal as the second enable signal 5, the second switch element 2 turns on after the power supply voltage (VDD2) of the second power supply line 22 becomes equal to or higher than the predetermined voltage (as for the details, see the first embodiment). As a result, the first power supply voltage (VDD1) is supplied from the first power supply line 21 to the second power supply line 22 through the second switch element 2.

According to the second embodiment as described above, it is possible to provide a power supply switch circuit capable of suppressing generation of a rush current without increasing the chip area. In particular, in the power supply switch circuit according to the second embodiment, the configuration of the first switch circuit 11 can be further simplified.

Third Embodiment

Figure 6:
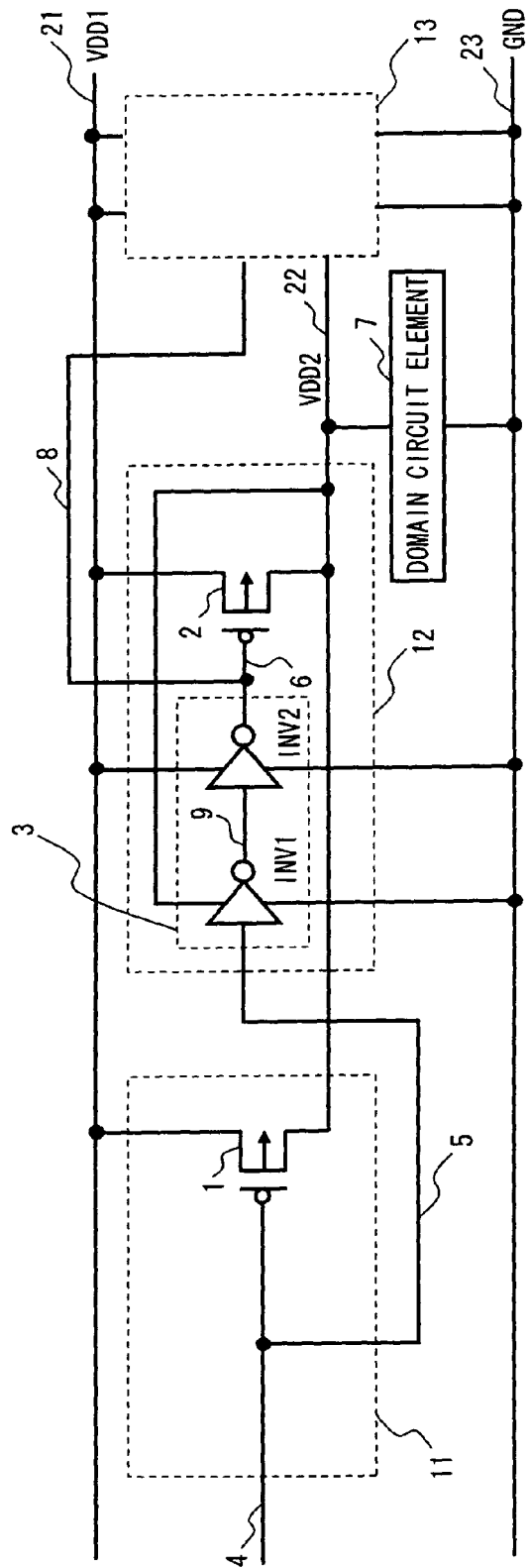
FIG. 6 is a block diagram showing a power supply switch circuit according to a third embodiment.

Next, a third embodiment of the present invention will be described. FIG. 6 is a block diagram showing a power supply switch circuit according to the third embodiment. The power supply switch circuit according to the third embodiment shown in FIG. 6 differs from the power supply switch circuit according to the first embodiment shown in FIG. 2 in the configuration of the first switch circuit 11. The other components are similar to those of the power supply switch circuit according to the first embodiment, and thus a redundant explanation thereof is omitted.

The first switch circuit 11 of the power supply switch circuit shown in FIG. 6 includes only the first switch element 1. The first switch element 1 is configured as a P-channel transistor, for example. The source of the first switch element 1 is connected to the first power supply line 21. The drain of the first switch element 1 is connected to the second power supply line 22. The gate of the first switch element 1 is supplied with the enable signal 4.

When the first switch circuit 11 is supplied with the low-level signal as the first enable signal 4, the gate of the first switch element 1 becomes low level, so that the first switch element 1 turns on. As a result, the first power supply voltage (VDD1) is applied from the first power supply line 21 to the second power supply line 22 through the first switch element 1.

In the power supply switch circuit according to the third embodiment, the signal identical with the first enable signal 4 is supplied as the second enable signal 5. When the inverter INV1 of the second switch circuit 12 is supplied with the low-level signal as the second enable signal 5, the second switch element 2 turns on after the power supply voltage (VDD2) of the second power supply line 22 becomes equal to or higher than the predetermined voltage (as for the details, see the first embodiment). As a result, the first power supply voltage (VDD1) is applied from the first power supply line 21 to the second power supply line 22 through the second switch element 2.

According to the third embodiment as described above, it is possible to provide a power supply switch circuit capable of suppressing generation of a rush current without increasing the chip area. In particular, in the power supply switch circuit according to the third embodiment, the configuration of the first switch circuit 11 can be further simplified.

Fourth Embodiment

Figure 7:
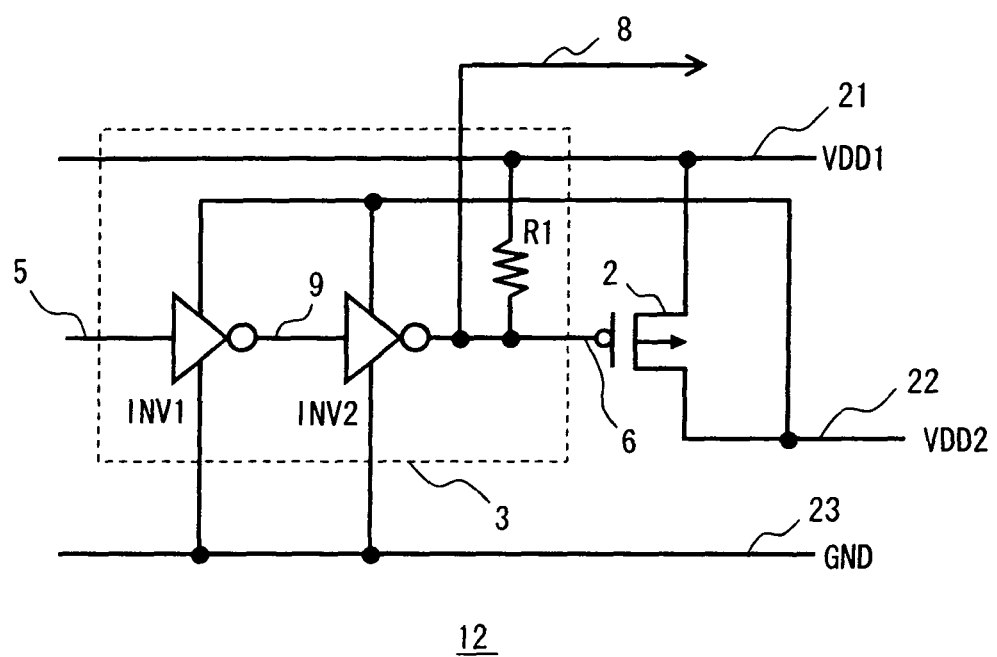
FIG. 7 is a circuit diagram showing a second switch circuit used for a power supply switch circuit according to a fourth embodiment.

Next, a fourth embodiment of the present invention will be described. FIG. 7 is a circuit diagram showing the second switch circuit used for a power supply switch circuit according to the fourth embodiment. The power supply switch circuit according to the fourth embodiment differs from the power supply switch circuits according to the first to third embodiments (see FIGS. 2, 5, and 6) in the configuration of the second switch circuit 12. The other components are similar to those of the power supply switch circuits according to the first to third embodiments, and thus a redundant explanation thereof is omitted.

The second switch circuit 12 includes the inverter INV1, the inverter INV2, a resistor element R1, and a second switch element 2. The inverter INV1, the inverter INV2, and the resistor element R1 constitute the switch control circuit 3.

The inverter INV1 is supplied with power from each of the second power supply line (VDD2) 22 and the third power supply line (GND) 23 and receives the second enable signal 5. The inverter INV1 outputs the signal 9, which is obtained by inverting the received second enable signal 5, to the inverter INV2. The inverter INV2 is supplied with power from each of the second power supply line (VDD2) 22 and the third power supply line (GND) 23, and is also supplied with the output signal from the inverter INV1. The inverter INV2 outputs the control signal 6, which is obtained by inverting the output signal from the inverter INV1, to the gate of the second switch element 2. In this case, the output signal from the inverter INV2 is supplied as the enable signal 8 to the subsequent-stage switch circuit.

The resistor element R1 is connected between the first power supply line (VDD1) 21 and the gate of the second switch element 2. The first switch element 2 is configured as a P-channel transistor, for example. The source of the second switch element 2 is connected to the first power supply line 21. The gate of the second switch element 2 is connected to each of the output of the inverter INV2 and one end of the resistor element R1. The drain of the second switch element 2 is connected to the second power supply line 22.

As in the first embodiment, when the inverter INV1 of the second switch circuit 12 is supplied with the low-level signal as the second enable signal 5, the inverter INV1 outputs the second power supply voltage (VDD2) to the inverter INV2.

When the second power supply voltage (VDD2) is lower than the threshold voltage of the inverter INV2, the inverter INV2 does not output the inverted signal. Accordingly, the inverter INV2 outputs the second power supply voltage (VDD2) as the control signal 6. At this time, the second power supply voltage (VDD2), which is the output voltage of the inverter INV2, is lower than the first power supply voltage (VDD1). As a result, the operation of the second switch element 2 becomes unstable. However, the gate voltage of the second switch element 2 can be increased to the first power supply voltage (VDD1) by connecting the resistor element R1 (for example, a resistor element having a high resistance) between the first power supply line (VDD1) 21 and the gate of the second switch element 2. This enables the second switch element 2 to be stably turned off.

On the other hand, when the first power supply voltage (VDD1) is continuously applied from the first power supply line 21 to the second power supply line 22 through the first switch element 1, the second power supply voltage (VDD2) rises. Then, when the second power supply voltage (VDD2) is higher than the threshold voltage of the inverter INV2 (voltage allowing the inverter INV2 to perform an inversion operation), the inverter INV2 outputs the third power supply voltage (GND), which is the low-level signal, as the control signal 6. The gate of the second switch element 2 is supplied with the low-level signal (GND), which allows the second switch element 2 to turn on. As a result, the first power supply voltage (VDD1) is applied from the first power supply line 21 to the second power supply line 22 through the second switch element 2.

In the power supply switch circuit according to the first embodiment shown in FIG. 2, the second power supply voltage (VDD2) rises over a long period of time after the first switch element 1 turns on. In this case, when the inverter INV2 is connected to the first power supply line 21, a through current transiently flows between the first power supply line 21 and the third power supply line 23.

As shown in FIG. 7, however, the second power supply voltage (VDD2), which is lower than the first power supply voltage (VDD1), is supplied as power for the inverter INV2, thereby reducing the through current transiently flowing through the inverter until the second power supply voltage (VDD2) reaches the threshold voltage of the inverter INV2.

Therefore, the power supply switch circuit according to the fourth embodiment can reduce the through current transiently flowing through the inverter, and can further reduce power consumption of the power supply switch circuit.

Fifth Embodiment

Figure 8:
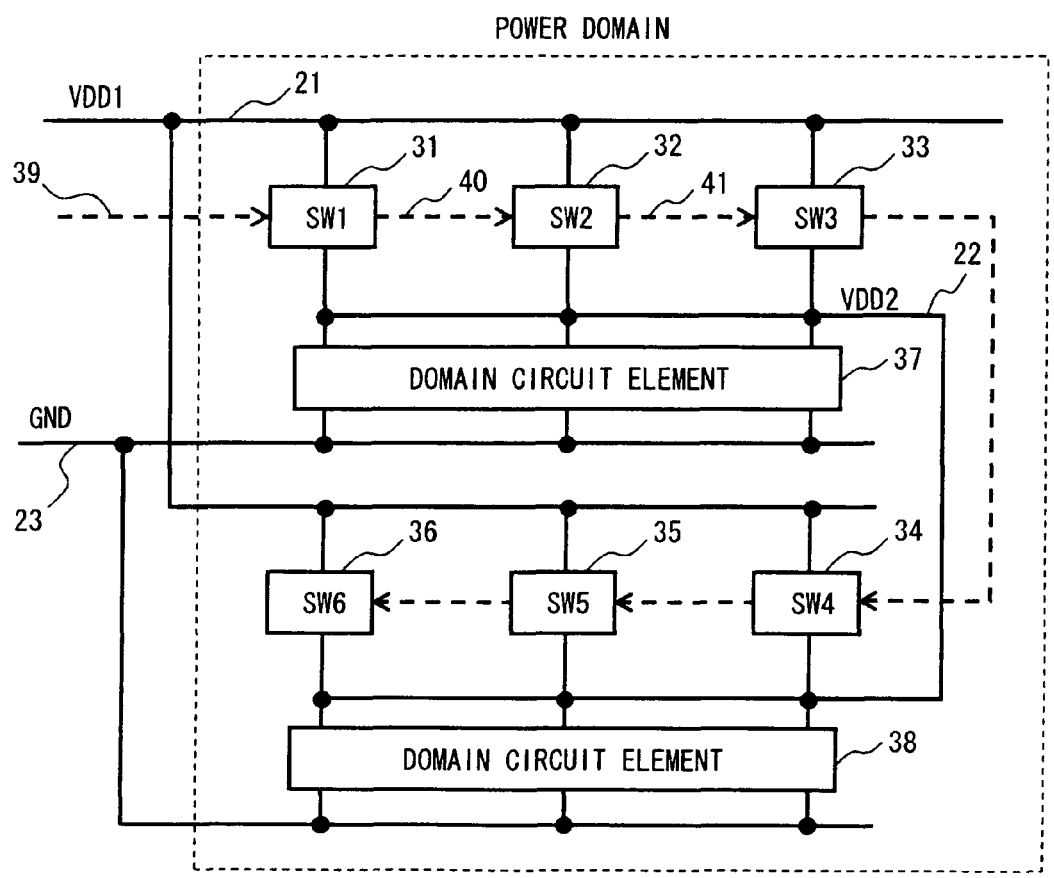
FIG. 8 is a diagram showing a power domain using a power supply switch circuit according to a fifth embodiment.

Next, a fifth embodiment of the present invention will be described. FIG. 8 is a diagram showing a power domain using a power supply switch circuit according to the fifth embodiment. As shown in FIG. 8, the power domain includes a first switch circuit (SW1) 31 to a sixth switch circuit (SW6) 36.

Domain circuit elements 37 and 38 are connected between the second power supply line (VDD2) 22 and the third power supply line (GND) 23.

In the power supply switch circuit according to the fifth embodiment, the first switch circuit 31 is configured as a circuit similar to the first switch circuit 11 shown in FIG. 2. The second switch circuit 32 is configured as a circuit similar to the second switch circuit 12 shown in FIG. 2. In the fifth embodiment, the threshold voltage of the inverter INV2 used for the second switch circuit 32 is set to be equal to the voltage between the threshold voltage of the inverter INV2 included in the third switch circuit 33 and the third power supply voltage (GND). That is, the threshold voltage of the inverter INV2 included in the second switch circuit 32 is set to be lower than that of the inverter INV2 included in the third switch circuit 33. The third switch circuit 33 is configured as a circuit similar to the second switch circuit 12 shown in FIG. 2.

Each of the fourth switch circuit 34 to the sixth switch circuit 36 is configured as a circuit similar to the first switch circuit 11 shown in FIG. 2, for example. The fourth switch circuit 34 to the sixth switch circuit 36 shown in FIG. 8 are illustrated by way of example. Each of the fourth switch circuit 34 to the sixth switch circuit 36 may be configured as a switch circuit having a configuration similar to that of the second switch circuit 12 shown in FIG. 2. More alternatively, the fourth switch circuit 34 to the sixth switch circuit 36 may be formed by an arbitrary combination of circuits having a configuration similar to that of the first switch circuit 11 shown in FIG. 2 and circuits having a configuration similar to that of the second switch circuit 12 shown in FIG. 2.

Next, operation of the power domain using the power supply switch circuit according to the fifth embodiment shown in FIG. 8 will be described. The operation of the power domain using the power supply switch circuit shown in FIG. 8 is partially similar to the operation of the power supply switch circuit according to the first embodiment described above with reference to FIG. 2, and thus a redundant explanation thereof is omitted as appropriate.

As in the power supply switch circuit shown in FIG. 2, when the low-level signal is supplied to the first switch circuit 31 as a first enable signal 39, the switch element included in the first switch circuit 31 turns on. As a result, the first power supply voltage (VDD1) is applied from the first power supply line 21 to the second power supply line 22 through the first switch circuit 31.

As in the power supply switch circuit shown in FIG. 2, the low-level signal is output as a second enable signal 40 from the first switch circuit 31. When the low-level signal is supplied as the second enable signal 40 to the inverter INV1 of the second switch circuit 32, the inverter INV1 outputs the second power supply voltage (VDD2) to the inverter INV2.

The threshold voltage of the inverter INV2 included in the second switch circuit 32 is set to be lower than that of the inverter INV2 included in the third switch circuit 33. Accordingly, when the switch element included in the first switch circuit 31 turns on and the second power supply voltage (VDD2) gradually rises, and when the second power supply voltage (VDD2) is higher than the threshold voltage of the inverter INV2 included in the second switch circuit 32, the switch element included in the second switch circuit 32 turns on. As a result, the first power supply voltage (VDD1) is applied from the first power supply line 21 to the second power supply line 22 through the second switch circuit 32.

In other words, since the threshold voltage of the inverter INV2 included in the second switch circuit 32 is set to be lower than that of the inverter INV2 included in the third switch circuit 33, the second switch circuit 32 applies the first power supply voltage (VDD1) from the first power supply line 21 to the second power supply line 22, prior to the application of the first power supply voltage by the third switch circuit 33.

At this time, the first power supply voltage (VDD1) is applied from the first power supply line 21 to the second power supply line 22 through the first switch circuit 31 and the second switch circuit 32.

Then, when the second power supply voltage (VDD2) is higher than the threshold voltage of the inverter INV2 included in the third switch circuit 33, the switch element 2 included in the third switch circuit 33 turns on. As a result, the first power supply voltage (VDD1) is applied from the first power supply line 21 to the second power supply line 22 through the third switch circuit 33.

After that, the fourth switch circuit 34 to the sixth switch circuit 36 operate in the same manner as the power supply switch circuit shown in FIG. 2. For example, in the case where each of the fourth switch circuit 34 to the sixth switch circuit 36 is configured as a circuit similar to the first switch circuit 11 shown in FIG. 2, the fourth switch circuit 34 to the sixth switch circuit 36 sequentially turn on after the enable signal is output from the third switch circuit 33.

As described above, in the power supply switch circuit according to the fifth embodiment, the second switch circuit 32 is allowed to turn on after the first switch circuit 31 turns on and before the third switch circuit 33 turns on. As a result, the first power supply voltage (VDD1) is applied from the first power supply line 21 to the second power supply line 22 through the first switch circuit 31 and the second switch circuit 32 after the second switch circuit 32 turns on. As a result, the second power supply voltage can be increased more rapidly than the case of the first embodiment. This leads to a shortening of the time for turning on the third switch circuit 33.

The power supply switch circuit in which only one switch circuit includes the inverter INV2 having a low threshold voltage has been described by way of example with reference to FIG. 8. However, in the power supply switch circuit, a plurality of switch circuits may include the inverter INV2 having a low threshold voltage. In the case of providing a plurality of switch circuits each including the inverter INV2 whose threshold voltage is set to the low level, the inverters INV2 may have different threshold voltages.

Sixth Embodiment

Next, a sixth embodiment of the present invention will be described. In a power supply switch circuit according to the sixth embodiment, the first switch element 1 of the first switch circuit 11 and the second switch element 2 of the second switch circuit 12, which have been described in the first embodiment, are each configured as an N-channel transistor. The second to fifth embodiments can also be applied to the power supply switch circuit according to the sixth embodiment.

Figure 9:
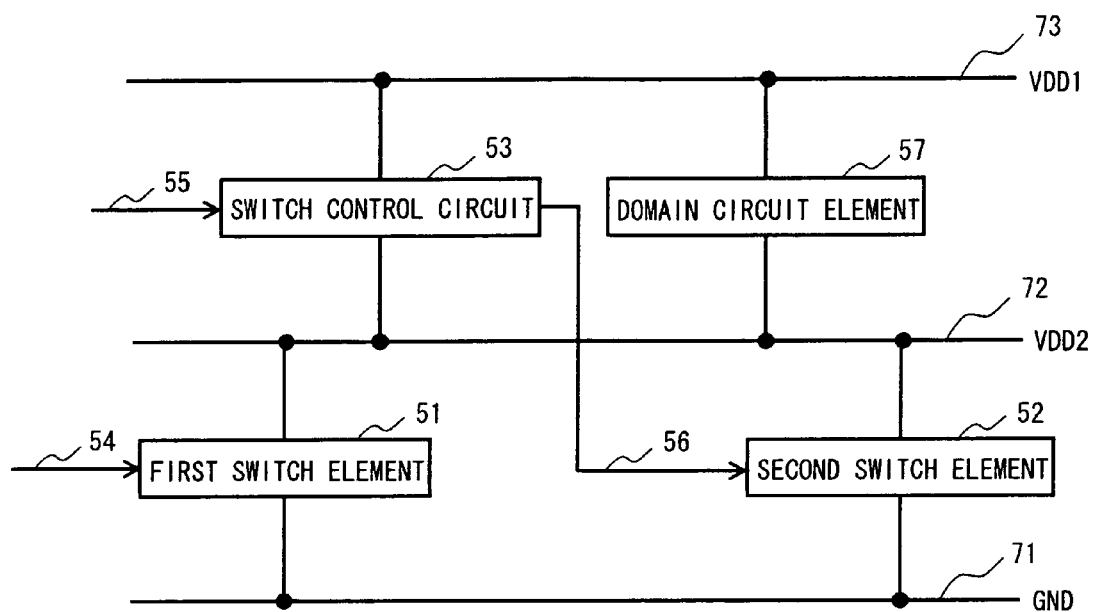
FIG. 9 is a block diagram shown in the power supply switch circuit according to the fifth embodiment.

FIG. 9 is a block diagram showing the power supply switch circuit according to the sixth embodiment. The power supply switch circuit shown in FIG. 9 includes a first switch element 51, a second switch element 52, and a switch control circuit 53. The power supply switch circuit according to the sixth embodiment is a power supply switch circuit that applies a power supply voltage from a first power supply line (GND) 71 to a second power supply line (VDD2) 72. A domain circuit element 57 is connected between the second power supply line (VDD2) 72 and a third power supply line (VDD1) 73.

The first switch element 51 is connected between the first power supply line 71 and the second power supply line 72, and switches connection and disconnection between the first power supply line 71 and the second power supply line 72 according to a first enable signal 54.

The second switch element 52 is connected between the first power supply line 71 and the second power supply line 72, and switches connection and disconnection between the first power supply line 71 and the second power supply line 72 according to a control signal 56 output from the switch control circuit 53.

The switch control circuit 53 includes at least one logic gate supplied with power from the second power supply line 72, and controls the second switch element 52. Specifically, the switch control circuit 53 controls the second switch element 52 based on a second enable signal 55 supplied to the switch control circuit 53 and the second power supply voltage (VDD2) which is the voltage of the second power supply line 72. Hereinafter, a specific circuit example of the power supply switch circuit according to the sixth embodiment will be described.

Figure 10:
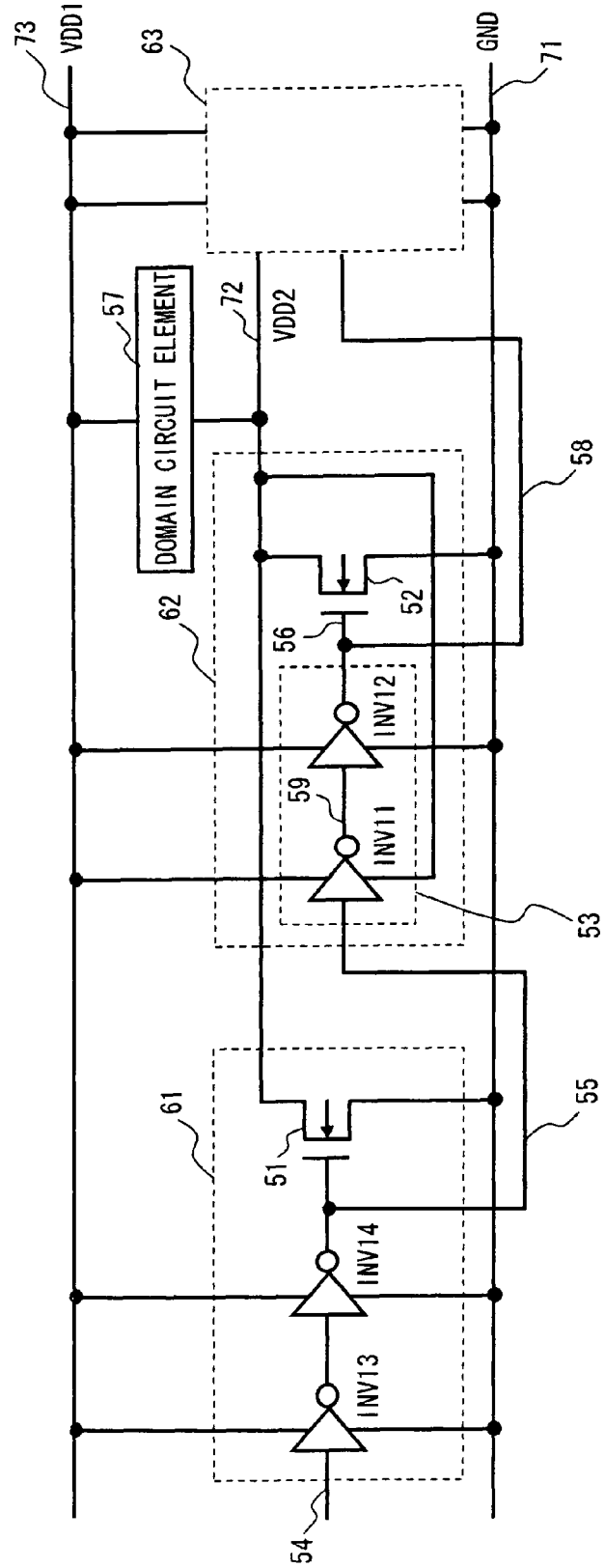
FIG. 10 is a circuit diagram showing a power supply switch circuit according to a sixth embodiment.

FIG. 10 is a circuit diagram showing the power supply switch circuit according to the sixth embodiment. The power supply switch circuit shown in FIG. 10 includes a first switch circuit 61 and a second switch circuit 62. The first switch circuit 61 includes an inverter (fifth inverter) INV13, an inverter (sixth inverter) INV14, and the first switch element 51.

The inverter INV13 is supplied with power from each of the first power supply line (GND) 71 and the third power supply line (VDD1) 73 and receives the first enable signal 54. The inverter INV13 inverts the received first enable signal 54 and outputs the inverted signal to the inverter INV14. The inverter INV14 is supplied with power from each of the first power supply line (GND) 71 and the third power supply line (VDD1) 73, and is also supplied with the output signal from the inverter INV13. The inverter INV14 inverts the output signal from the inverter INV13 and outputs the inverted signal to the gate of the first switch element 51.

In this case, the output signal from the inverter INV14 is supplied to the second switch circuit 62 as the second enable signal 55. In the circuit shown in FIG. 10, the first enable signal 54 may be supplied as the second enable signal 55 to the second switch circuit 62.

The first switch element 51 is configured as an N-channel transistor, for example. The source of the first switch element 51 is connected to the first power supply line 71. The gate of the first switch element 51 is connected to the output of the inverter INV14. The drain of the first switch element 51 is connected to the second power supply line 72.

The second switch circuit 62 includes an inverter (first inverter) INV11, an inverter (second inverter) INV12, and the second switch element 52. The inverter INV11 and the inverter INV12 constitute the switch control circuit 53.

The inverter INV11 is supplied with power from each of the second power supply line (VDD2) 72 and the third power supply line (VDD1) 73 and receives the second enable signal 55. The inverter INV11 outputs a signal 59, which is obtained by inverting the received second enable signal 55, to the inverter INV12. The inverter INV12 is supplied with power from each of the first power supply line (GND) 71 and the third power supply line (VDD1) 73, and is also supplied with the output signal from the inverter INV11. The inverter INV12 outputs the control signal 56, which is obtained by inverting the output signal from the inverter INV11, to the gate of the second switch element 52. In this case, the output signal from the inverter INV12 is supplied as an enable signal 58 to the switch circuit 63 at the subsequent stage.

The second switch element 52 is configured as an N-channel transistor, for example. The source of the second switch element 52 is connected to the first power supply line 71. The gate of the second switch element 52 is connected to the output of the inverter INV12. The drain of the second switch element 52 is connected to the second power supply line 72.

The domain circuit element 57 is connected between the second power supply line (VDD2) 72 and the third power supply line (VDD1) 73. The power supply switch circuit according to the sixth embodiment may further include a plurality of switch circuits 63 at the subsequent stage of the second switch circuit 62.

Next, operation of the power supply switch circuit according to the sixth embodiment shown in FIG. 10 will be described. Though operations of the switch circuit 61 and the switch circuit 62 will be described below, similar operations are carried out also in the case where a larger number of switch circuits are provided.

When the low-level signal is supplied as the first enable signal 54 to the inverter INV13 of the first switch circuit 61, the inverter INV13 outputs the high-level signal (VDD1) to the inverter INV14. The term "low-level signal" herein described refers to a signal having a level that allows an inverter to perform an inversion operation and having a voltage lower than a threshold voltage of the inverter.

When the inverter INV14 is supplied with the high-level signal, which is the output signal from the inverter INV13, the inverter INV14 supplies the low-level signal (GND) to the gate of the first switch element 51. The gate of the first switch element 51 is supplied with the low-level signal, which allows the first switch element 51 to turn off.

The inverter INV14 outputs the low-level signal as the second enable signal 55. When the inverter INV11 of the second switch circuit 62 is supplied with the low-level signal as the second enable signal 55, the inverter INV11 outputs the high-level signal to the inverter INV12.

When the high-level signal is supplied to the inverter INV12, the inverter INV12 supplies the low-level signal to the gate of the second switch element 52. The low-level signal is supplied to the gate of the second switch element 52, which allows the second switch element 52 to turn off.

Accordingly, when the low-level signal is supplied as the first enable signal 54, the first switch element 51 and the second switch 52 turn off, so that the first power supply line 71 and the second power supply line 72 are disconnected.

On the other hand, when the inverter INV13 of the first switch circuit 61 is supplied with the high-level signal as the first enable signal 54, the inverter INV13 outputs the low-level signal to the inverter INV14. The term "high-level signal" herein described refers to a signal having a level that allows an inverter to perform an inversion operation and having a voltage higher than a threshold voltage of the inverter.

When the output signal from the inverter INV13, which is the low-level signal, to the inverter INV14, the inverter INV14 supplies the high-level signal to the gate of the first switch element 51. The gate of the first switch element 51 is supplied with the high-level signal, which allows the first switch element 51 to turn on. As a result, the first power supply voltage (GND) is applied from the first power supply line 71 to the second power supply line 72 through the first switch element 51.

The inverter INV14 outputs the high-level signal as the second enable signal 55. When the inverter INV11 of the second switch circuit 62 is supplied with the high-level signal as the second enable signal 55, the inverter INV11 outputs the second power supply voltage (VDD2) to the inverter INV12.

Figure 11:
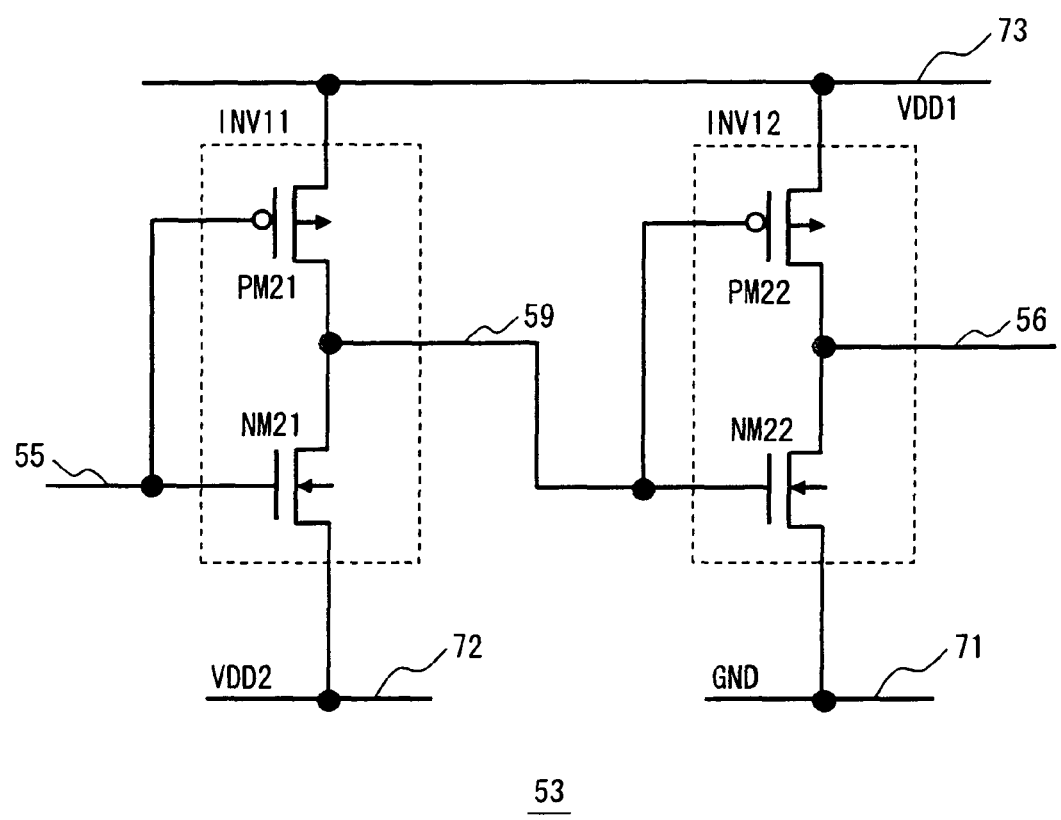
FIG. 11 is a circuit diagram showing a switch control circuit included in the power supply switch circuit according to the sixth embodiment.

FIG. 11 is a circuit diagram showing the switch control circuit including the power supply switch circuit according to the sixth embodiment. Specifically, as shown in FIG. 11, when the high-level signal is supplied as the second enable signal 55, a P-channel transistor PM21 included in the inverter INV11 turns off and an N-channel transistor NM21 included in the inverter INV11 turns on. As a result, the inverter INV11 outputs the second power supply voltage (VDD2) as the signal 59.

The second power supply voltage (VDD2), which is supplied as the signal 59 to the inverter INV12, is supplied to the gate of a P-channel transistor PM22 and the gate of an N-channel transistor NM22. The P-channel transistor PM22 and the N-channel transistor NM22 constitute the inverter INV12. In this case, when the second power supply voltage (VDD2) is higher than the threshold voltage of the inverter INV12, i.e., when the second power supply voltage (VDD2) is higher than the threshold voltage of the P-channel transistor PM22, the P-channel transistor PM22 is maintained in the off state and the N-channel transistor NM22 is maintained in the on state. Accordingly, the inverter INV12 outputs the first power supply voltage (GND), which is the low-level signal, as the control signal 56. The gate of the second switch element 52 is supplied with the low-level signal (GND), which allows the second switch element 52 to be maintained in the off state.

On the other hand, when the first power supply voltage (GND) is continuously applied from the first power supply line 71 to the second power supply line 72 through the first switch element 51, the second power supply voltage (VDD2) drops. Then, when the second power supply voltage (VDD2) is lower than the threshold voltage of the inverter INV12 (voltage allowing the inverter INV12 to perform an inversion operation), i.e., when the second power supply voltage (VDD2) is lower than the threshold voltage of the P-channel transistor PM22, the P-channel transistor PM22 turns on and the N-channel transistor NM22 turns off. At this time, the inverter INV12 outputs the third power supply voltage (VDD1), which is the high-level signal, as the control signal 56. The gate of the second switch element 52 is supplied with the high-level signal (VDD1), which allows the second switch element 52 to turn on. As a result, the first power supply voltage (GND) is applied from the first power supply line 71 to the second power supply line 72 through the second switch element 52.

As described above, in the power supply switch circuit according to the sixth embodiment, the second switch element 52 is allowed to be maintained in the off state during a period between the time when the first switch element 51 turns on and the first power supply voltage (GND) is applied from the first power supply line 71 to the second power supply line 72 through the first switch element 51 and the time when the power supply voltage (VDD2) of the second power supply line 72 becomes equal to or lower than the predetermined voltage. After the second power supply voltage (VDD2) becomes equal to or lower than the predetermined voltage, the first power supply voltage (GND) can be applied from the first power supply line 71 to the second power supply line 72 through the second switch element 52.

At this time, only the first switch element 51 connects the first power supply line 71 and the second power supply line 72 until the second power supply voltage (VDD2) becomes equal to or lower than the threshold voltage of the inverter INV12. Accordingly, the first power supply line 71 and the second power supply line 72 are connected through a high resistance, thereby suppressing generation of a rush current.

In conjunction with this, generation of power supply noise can also be suppressed. After the second power supply voltage (VDD2) becomes equal to or lower than the predetermined voltage, the second switch element 52 connects the first power supply line 71 and the second power supply line 72. At this time, the potential difference between the first power supply line 71 and the second power supply line 72 is small, which results in suppressing generation of a rush current. Accordingly, generation of power supply noise can also be suppressed.

In the power supply switch circuit according to the sixth embodiment, circuits for implementing the above-mentioned operation can be formed using the inverter circuit INV11, which is supplied with power from the second power supply line; and the inverter circuit INV12. This eliminates the need for adding a dedicated control circuit. Consequently, an increase in the chip area can be suppressed.

Figure 12:
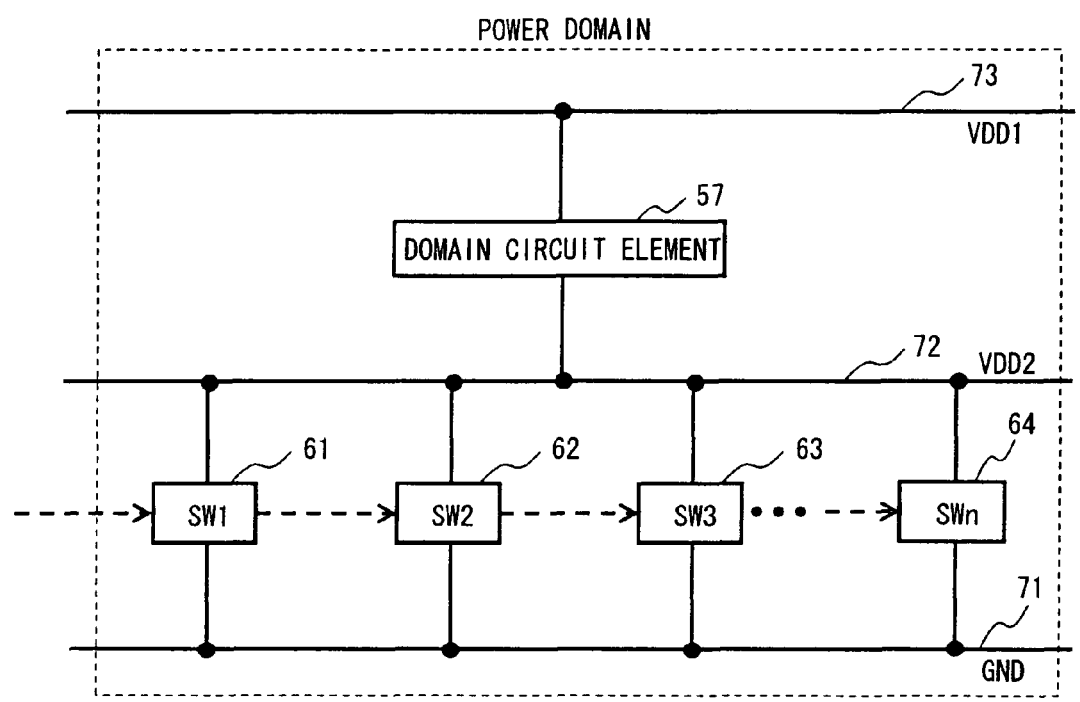
FIG. 12 is a diagram showing a power domain using the power supply switch circuit according to the sixth embodiment.
Figure 13:
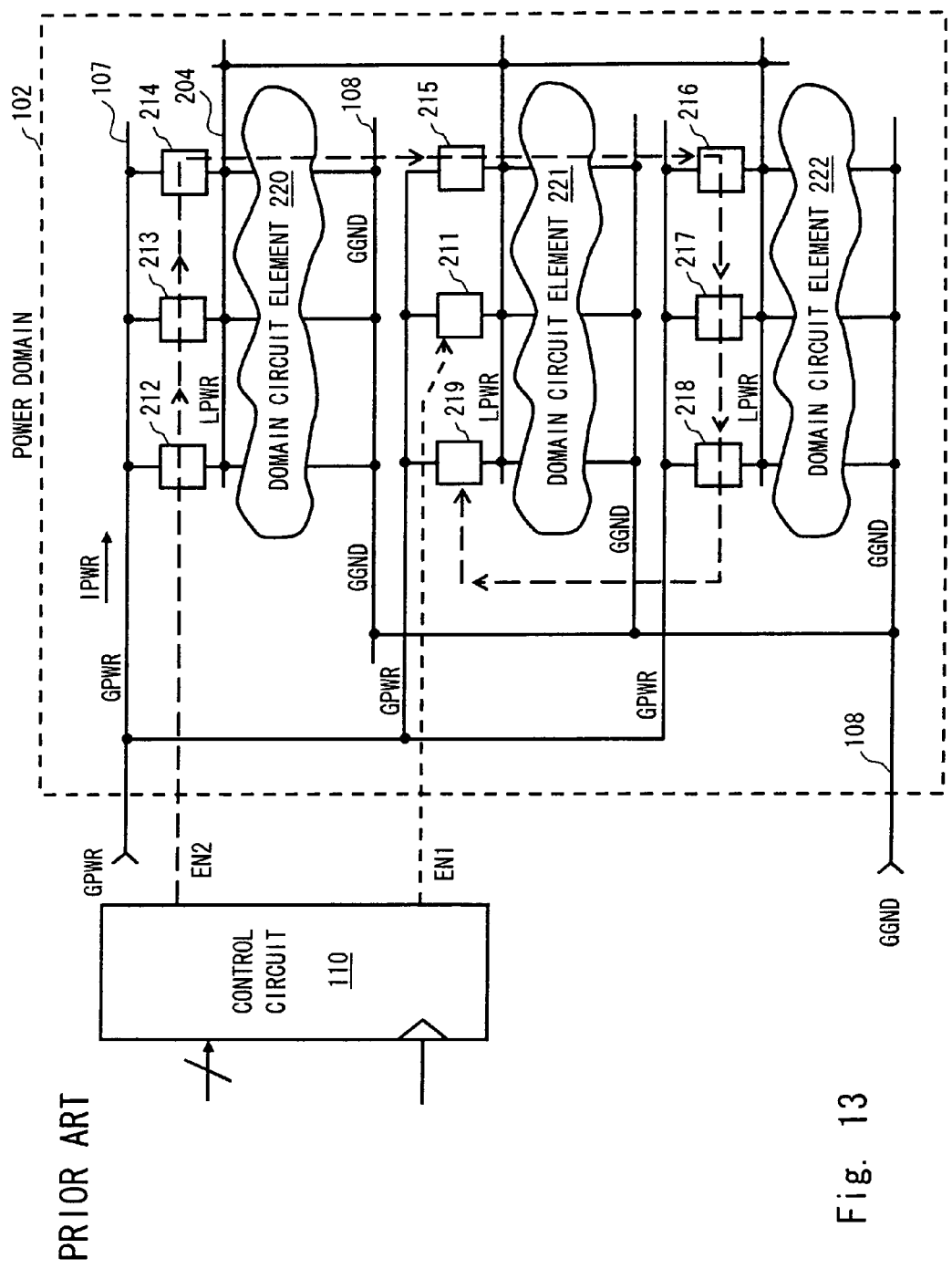
FIG. 13 is an explanatory diagram of a power supply switch circuit disclosed in Published Japanese Translation of PCT International Publication for Patent Application, No. 2008-532265.

FIG. 12 is a diagram showing the power domain using the power supply switch circuit according to the sixth embodiment. As shown in FIG. 12, the power domain includes the first switch circuit (SW1) to the n-th switch circuit (SWn). The domain circuit element 57 is connected between the second power supply line (VDD2) 72 and the third power supply line (VDD1) 73.

In the power supply switch circuit according to the sixth embodiment, the first switch circuit (SW1) 61 is configured as the first switch circuit 61 shown in FIG. 10. The second switch circuit (SW2) 62 is configured as the second switch circuit 62 shown in FIG. 10. Each switch circuit subsequent to the third switch circuit (SW3) 63 may be configured as a switch circuit having a configuration similar to that of the first switch circuit 61 shown in FIG. 10, or may be configured as a switch circuit having a configuration similar to that of the second switch circuit 62 shown in FIG. 10. In other words, the circuits in the power domain shown in FIG. 12 may be formed by an arbitrary combination of circuits having a configuration similar to that of the first switch circuit 61 shown in FIG. 10 and circuits having a configuration similar to that of the second switch circuit 62 shown in FIG. 10.

As described above, according to the above embodiments of the present invention, it is possible to provide a power supply switch circuit capable of suppressing generation of a rush current without increasing the chip area.

The first to sixth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A power supply switch circuit that applies a power supply voltage from a first power supply line to a second power supply line, the power supply switch circuit comprising:
   a first switch element that is connected between the first power supply line and the second power supply line and switches connection and disconnection between the first power supply line and the second power supply line according to a first enable signal;

a second switch element that is connected between the first power supply line and the second power supply line and switches connection and disconnection between the first power supply line and the second power supply line; and a switch control circuit that includes at least one logic gate supplied with power from the second power supply line and controls the second switch element, wherein the switch control circuit controls the second switch element based on a second enable signal supplied to the switch control circuit and on a second power supply voltage, the second power supply voltage being a voltage of the second power supply line, wherein the switch control circuit comprises:

a first inverter that is supplied with power from each of the second power supply line and a third power supply line and receives the second enable signal; and a second inverter that is supplied with power from each of the first power supply line and the third power supply line and with an output signal from the first inverter, and outputs a control signal to a gate of the second switch element.

2. The power supply switch circuit according to claim 1, wherein the switch control circuit comprises:

a first inverter that is supplied with power from each of the second power supply line and a third power supply line and receives the second enable signal; and a second inverter that is supplied with power from each of the second power supply line and the third power supply line and with an output signal from the first inverter, and outputs a control signal to a gate of the second switch element; and a resistor element connected between the first power supply line and the gate of the second switch element.

3. The power supply switch circuit according to claim 2, wherein when the second power supply voltage output from the first inverter allows the second inverter to perform an inversion operation, the switch control circuit turns on the second switch element.

4. The power supply switch circuit according to claim 3, wherein in a case where the second switch element is a P-channel transistor, the switch control circuit turns on the second switch element when a low-level signal is supplied as the second enable signal to the first inverter and the second power supply voltage supplied to the second inverter is higher than a threshold voltage of the second inverter.

5. The power supply switch circuit according to claim 3, wherein in a case where the second switch element is an N-channel transistor, the switch control circuit turns on the second switch element when a high-level signal is supplied as the second enable signal to the first inverter and the second power supply voltage supplied to the second inverter is lower than a threshold voltage of the second power supply voltage.

6. The power supply switch circuit according to claim 1, wherein when the second power supply voltage output from the first inverter allows the second inverter to perform an inversion operation, the switch control circuit turns on the second switch element.

7. The power supply switch circuit according to claim 6, wherein in a case where the second switch element is a P-channel transistor, the switch control circuit turns on the second switch element when a low-level signal is supplied as the second enable signal to the first inverter and the second power supply voltage supplied to the second inverter is higher than a threshold voltage of the second inverter.

8. The power supply switch circuit according to claim 6, wherein in a case where the second switch element is an N-channel transistor, the switch control circuit turns on the second switch element when a high-level signal is supplied as the second enable signal to the first inverter and the second power supply voltage supplied to the second inverter is lower than a threshold voltage of the second inverter.

9. The power supply switch circuit according to claim 1, further comprising a circuit including:

a switch control circuit including a third inverter having a threshold voltage equal to a voltage between a threshold voltage of the second inverter and a power supply voltage of the third power supply line; and a third switch element that is controlled by the switch control circuit and is connected between the first power supply line and the second power supply line, the third switch element switching connection and disconnection between the first power supply line and the second power supply line.

10. The switch circuit according to claim 1, wherein the switch control circuit receives the first enable signal as the second enable signal.

11. The power supply switch circuit according to claim 1, further comprising a fourth inverter that is supplied with power from each of the first power supply line and a third power supply line and receives the first enable signal, wherein the fourth inverter outputs a signal obtained by inverting the first enable signal to a gate of the first switch element, and outputs the signal obtained by inverting the first enable signal as the second enable signal to the switch control circuit.

12. The power supply switch circuit according to claim 1, further comprising:

a fifth inverter that is supplied with power from each of the first power supply line and a third power supply line and receives the first enable signal; and a sixth inverter that is supplied with power from each of the first power supply line and the third power supply line and with an output signal from the fifth inverter, and outputs a signal obtained by inverting the output signal from the fifth inverter to a gate of the first switch element.

13. The power supply switch circuit according to claim 12, wherein the switch control circuit receives the first enable signal as the second enable signal.

14. The power supply switch circuit according to claim 12, wherein the sixth inverter outputs the signal obtained by inverting the output signal from the fifth inverter as the second enable signal to the switch control circuit.

15. The power supply switch circuit according to claim 1, further comprising:

a plurality of circuits including the first switch element; and a plurality of circuits including the second switch element and the switch control circuit.

16. A semiconductor device comprising:

a power supply wiring comprising a first power supply line;

an another wiring comprising a second power supply line;

a first switch configured to couple the power supply wiring to another wiring in response to a first control signal;

a second switch configured to couple the power supply wiring to the another wiring in response to a second control signal;

a switch control circuit configured to generate the second control signal based on a logic gate supplied power from the another wiring, wherein the switch control circuit comprises:

a first inverter that is supplied with power from each of the second power supply line and a third power supply line and receives the second control signal; and a second inverter that is supplied with power from each of the first power supply line and the third power supply line and with an output signal from the first inverter, and outputs a control signal to a gate of the second switch element.

17. The semiconductor device according to claim 16, wherein the switch control circuit generates the second control signal in response to the first control signal through the logic gate.

* * * * *